(12) United States Patent
Wang et al.

(10) Patent No.: US 11,588,134 B2
(45) Date of Patent: Feb. 21, 2023

(54) ENCAPSULATION LAYER STRUCTURE FOR DISPLAY PANEL, METHOD OF MANUFACTURING DISPLAY DEVICE AND DISPLAY PANEL

(71) Applicant: BOE TECHNOLOGY GROUP CO., LTD., Beijing (CN)

(72) Inventors: Youwei Wang, Beijing (CN); Song Zhang, Beijing (CN); Tao Sun, Beijing (CN); Peng Cai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 251 days.

(21) Appl. No.: 16/981,380

(22) PCT Filed: Apr. 20, 2020

(86) PCT No.: PCT/CN2020/085629
§ 371 (c)(1),
(2) Date: Sep. 16, 2020

(87) PCT Pub. No.: WO2020/238473
PCT Pub. Date: Dec. 3, 2020

(65) Prior Publication Data
US 2021/0143368 A1 May 13, 2021

(30) Foreign Application Priority Data
May 30, 2019 (CN) .......................... 201910461232.X

(51) Int. Cl.
*H01L 51/52* (2006.01)
*H01L 51/56* (2006.01)
(Continued)

(52) U.S. Cl.
CPC .......... *H01L 51/5253* (2013.01); *H01L 51/56* (2013.01); *H01L 27/3246* (2013.01);
(Continued)

(58) Field of Classification Search
CPC ................ H01L 51/5253; H01L 51/56; H01L 51/3246; H01L 51/5012; H01L 51/5206;
(Continued)

(56) References Cited

U.S. PATENT DOCUMENTS

2016/0285038 A1    9/2016    Kim
2017/0031323 A1*   2/2017    Kim .................... H01L 27/3258
(Continued)

FOREIGN PATENT DOCUMENTS

CN    106711171 A    5/2017
CN    108428802 A    8/2018
(Continued)

OTHER PUBLICATIONS

First Office Action dated Nov. 2, 2020, relating to CN Patent Application No. 201910461232.X.

*Primary Examiner* — Lex H Malsawma
(74) *Attorney, Agent, or Firm* — Dinsmore & Shohl LLP

(57) ABSTRACT

The present application discloses a display panel, a method of manufacturing the display panel and a display device. A display panel, including: a display substrate having a display area and a non-display area, the display substrate including a substrate; a dam on the upper surface of the non-display area of the display substrate; and an encapsulation layer covering the display substrate, wherein the encapsulation layer includes an organic layer, the upper surface of the non-display area of the display substrate is further provided with an isolation column, and a distance between the isolation column and the display area is smaller than a distance between the dam and the display area, the isolation column is at least partially in contact with the organic layer, and the dam is at least partially not in contact with the organic layer.

22 Claims, 2 Drawing Sheets

(51) Int. Cl.
    *H01L 27/32*    (2006.01)
    *H01L 51/50*    (2006.01)
(52) U.S. Cl.
    CPC ...... *H01L 51/5012* (2013.01); *H01L 51/5206* (2013.01); *H01L 51/5221* (2013.01)
(58) Field of Classification Search
    CPC ............ H01L 51/5221; H01L 51/5246; H01L 27/3244; H01L 27/32; H01L 27/3223
    USPC .......................................................... 257/40
    See application file for complete search history.

(56)            References Cited

U.S. PATENT DOCUMENTS

| | | | |
|---|---|---|---|
| 2017/0141352 A1 | 5/2017 | Shin | |
| 2019/0305244 A1* | 10/2019 | Jiang | ..................... H01L 51/525 |
| 2020/0044190 A1* | 2/2020 | Luo | ......................... H01L 51/56 |
| 2020/0185647 A1* | 6/2020 | Lee | ..................... H01L 27/3246 |
| 2020/0295102 A1 | 9/2020 | Qin et al. | |

FOREIGN PATENT DOCUMENTS

| | | | |
|---|---|---|---|
| CN | 108962953 A | 12/2018 | |
| CN | 109065763 A | 12/2018 | |
| CN | 109256486 A | 1/2019 | |
| CN | 109801956 A | 5/2019 | |
| CN | 110148617 A | 8/2019 | |
| KR | 20190031042 A | 3/2019 | |

\* cited by examiner

ENCAPSULATION LAYER STRUCTURE FOR DISPLAY PANEL, METHOD OF MANUFACTURING DISPLAY DEVICE AND DISPLAY PANEL

CROSS REFERENCE OF RELATED APPLICATIONS

This application is a national stage of International Application No. PCT/CN2020/085629, filed on Apr. 20, 2020, which claims priority to Chinese Patent Application No. 201910461232.X, filed on May 30, 2019. Both of the aforementioned applications are hereby incorporated by reference in their entireties.

TECHNICAL FIELD

The present disclosure relates to the field of display technology, in particular to a display panel, a method of manufacturing a display panel, and a display device.

BACKGROUND

Comparing with the liquid crystal display (LCD), the organic light emitting diode (OLED) display device has the advantages of being thin and light, having wide viewing angle, emitting light actively, color of emitting light being continuous adjustable, having low cost, fast response, low energy consumption, low driving voltage, wide operating temperature range, simple production process and high luminous efficiency, so it is expected to become the next generation of new flat panel display to replace LCD.

SUMMARY OF THE INVENTION

According to a first aspect of the present disclosure, there is provide a display panel, including:
a display substrate having a display area and a non-display area, the display substrate including a substrate;
a dam on an upper surface of the non-display area of the display substrate; and
an encapsulation layer covering the display substrate,
wherein the encapsulation layer includes an organic layer, the upper surface of the non-display area of the display substrate is further provided with an isolation column, and a distance between the isolation column and the display area is smaller than a distance between the dam and the display area, the isolation column is at least partially in contact with the organic layer, and the dam is at least partially not in contact with the organic layer, a width of a surface of the isolation column that is away from the substrate in a cross section along a direction perpendicular to the substrate is larger than that a width of a surface that is close to the substrate.

In some embodiments of the present disclosure, a width of a cross-section of the isolation column along the direction perpendicular to the substrate gradually increases as the distance from the upper surface of the non-display area of the display substrate increases.

In some embodiments of the present disclosure, a minimum value of the width of the cross-sectional of the isolation column along the direction perpendicular to the substrate is greater than or equal to about 10 microns.

In some embodiments of the present disclosure, the cross section of the isolation column along the direction perpendicular to the substrate is an inverted trapezoid, the inverted trapezoid includes a bottom surface, a top surface and two side wall surfaces connecting the bottom surface and the top surface, there is an included angle between the side wall surface closer to the display area and the upper surface of the display substrate, and the included angle is an acute angle.

In some embodiments of the present disclosure, the included angle is greater than or equal to about 40 degrees and less than or equal to about 70 degrees.

In some embodiments of the present disclosure, the included angle is about 60 degrees.

In some embodiments of the present disclosure, the encapsulation layer further comprises a first inorganic layer and a second inorganic layer, the organic layer is sandwiched between the first inorganic layer and the second inorganic layer, the first inorganic layer is closer to the display substrate than the second inorganic layer, and the isolation column is wrapped by the first inorganic layer.

In some embodiments of the present disclosure, the first inorganic layer includes a central portion, a laterally extending portion and a wrapping portion, the central portion at least covers the display area, the wrapping portion covers the isolation column, the lateral extending portion connects the wrapping portion and the central portion and is located on a side of the wrapping portion close to the display area;
a width of the lateral extending portion is greater than or equal to about 50 microns.

In some embodiments of the present disclosure, the central portion covers the display area and an area of the non-display area close to the display area, and has a stepped shape;
a height of the lateral extending portion from the substrate is smaller than heights of the central portion and the wrapping portion from the substrate.

In some embodiments of the present disclosure, multiple isolation columns are provided, each of the isolation columns is ring-shaped and surrounds the display area, and the isolation column farther away from the display area surrounds the isolation columns closer to the display area.

In some embodiments of the present disclosure, the display panel is an OLED panel.

In some embodiments of the present disclosure, the display area comprises a cover insulating layer on the substrate, a planarization layer on the cover insulating layer, and an organic light emitting layer on the planarization layer.

In some embodiments of the present disclosure, the organic light emitting layer comprises a first electrode layer, a pixel defining layer, a light emitting material layer, and a second electrode layer that are sequentially stacked.

In some embodiments of the present disclosure, the light emitting material layer comprises a first organic layer, a light emitting layer and a second organic layer that are sequentially stacked.

In some embodiments of the present disclosure, the first electrode layer serves as an anode, the second electrode layer serves as a cathode, the first organic layer serves as a hole transport layer and a hole injection layer, the second organic layer serves as an electron injection layer and an electron transport layer.

In some embodiments of the present disclosure, the first electrode layer serves as a cathode, the second electrode layer serves as an anode, the first organic layer serves as an electron injection layer and an electron transport layer, and the second organic layers serves as a hole transport layer and a hole injection layer.

In some embodiments of the present disclosure, the isolation column and the light emitting material layer are located in the same layer and are formed of the same material.

In some embodiments of the present disclosure, the isolation column and the second electrode layer are located in the same layer and are formed of the same material.

In some embodiments of the present disclosure, the isolation column is formed of a negative photoresist or a positive photoresist.

According to a second aspect of the present disclosure, there is provided a method of manufacturing the above display panel according to the present disclosure, wherein the method of manufacturing the display panel comprises the following steps:

forming a planarization layer on the substrate;

forming an organic light emitting layer, an isolation column and a dam on the planarization layer, the organic light emitting layer, the planarization layer and the substrate serves as the display substrate; and forming the encapsulation layer on the organic light emitting layer and the isolation column, wherein the encapsulation layer includes an organic layer, an upper surface of the non-display area of the display substrate is further provided with an isolation column, and a distance between the isolation column and the display area is smaller than a distance between the dam and the display area, the isolation column is at least partially in contact with the organic layer, and the dam is at least partially not in contact with the organic layer, a width of a surface of the isolation column that is away from the substrate in a cross section along a direction perpendicular to the substrate is larger than that a width of a surface that is close to the substrate.

In some embodiments of the present disclosure, the step of forming an organic light emitting layer on the planarization layer comprises:

forming a first electrode layer on the planarization layer;

forming a pixel defining layer on the first electrode layer;

forming a light emitting material layer on the pixel defining layer; and forming a second electrode layer on the light emitting material layer;

wherein the isolation column is formed between the step of forming the light emitting material layer on the pixel defining layer and the step of forming the second electrode layer on the light emitting material layer, or the isolation column is formed synchronously with the light emitting material layer, or the isolation column is formed synchronously with the second electrode layer.

In some embodiments of the present disclosure, the isolation column is formed by irradiating a low temperature negative photoresist.

According to a third aspect of the present disclosure, there is provided a display device, wherein the display device includes the above display panel according to the present disclosure.

It should be understood that the above general descriptions and the later detailed descriptions are merely illustrative and for explanation and do not limit the present disclosure.

DETAILED DESCRIPTION OF THE EMBODIMENTS

Here, exemplary embodiments will be described in detail, and examples thereof are shown in the accompanying drawings. When the following description refers to the drawings, unless otherwise indicated, the same numbers in different drawings indicate the same or similar elements. The implementation manners described in the following exemplary embodiments do not represent all implementation manners consistent with the present disclosure. Rather, they are merely examples of devices and methods consistent with some aspects of the present disclosure as detailed in the appended claims.

The terms used in the present disclosure are only for the purpose of describing specific embodiments, and are not intended to limit the present disclosure. The singular forms "a", "said" and "the" used in the present disclosure and appended claims are also intended to include plural forms, unless the context clearly indicates other meanings. It should also be understood that the term "and/or" used herein refers to and includes any or all possible combinations of one or more associated listed items.

It should be understood that the "first", "second" and similar words used in the specification and claims of the present disclosure do not denote any order, quantity or importance, but are only used to distinguish different components. Similarly, similar words such as "a" or "an" do not mean a quantity limit, but mean that there is at least one. Unless otherwise indicated, similar words such as "front", "rear", "lower" and/or "upper" are only for convenience of description, and are not limited to one position or one spatial orientation. "Including" or "comprising" and other similar words mean that the elements or items before "including" or "comprising" now cover the elements or items listed after "including" or "including" and their equivalents, and do not exclude other elements or objects. Similar words such as "connected" or "connection" are not limited to physical or mechanical connections, and may include electrical connections, whether direct or indirect.

The embodiments of the present disclosure will be described in detail below with reference to the accompanying drawings. In the case of no conflict, the following embodiments and features in the implementation can be combined with each other.

Since the electrodes and the organic layer are easily corroded by water and oxygen, their lifespan is reduced, so they need to be encapsulated. In the prior art, for flexible displays, Thin Film Encapsulation (TFE) is one of the most commonly used encapsulation methods.

However, the inventor(s) of the present disclosure found that generally, during the encapsulation process, the organic layer constituting the encapsulation layer has good fluidity and is easy to overflow to the dam of the non-display area, and edge overflow occurs. The effective encapsulation cannot achieve.

Figure 1:
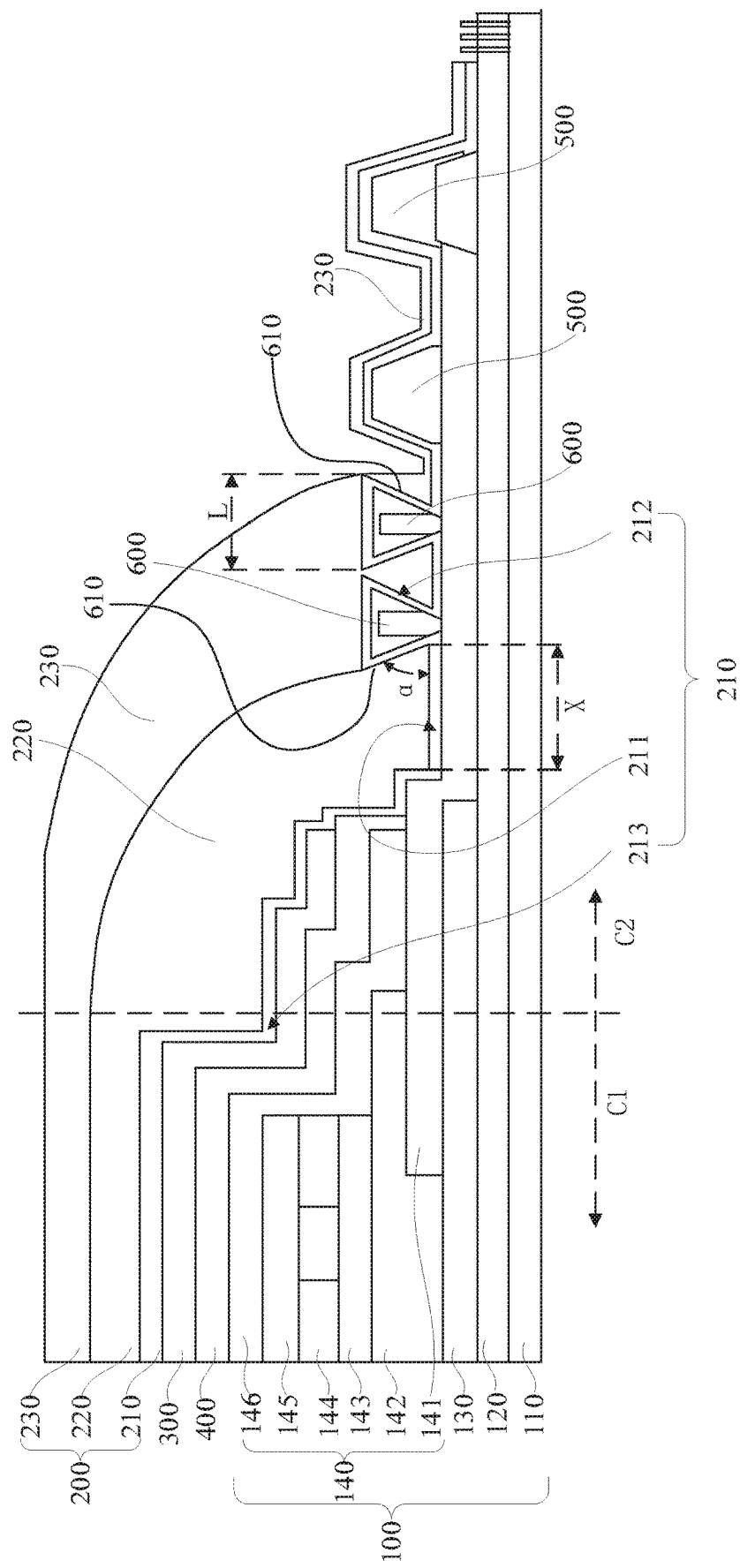
FIG. 1 is a sectional structure diagram of a display panel according to an embodiment of the present disclosure.

An embodiment of the present disclosure provides an OLED panel (i.e., a display panel). As shown in FIG. 1, the OLED panel includes a display substrate 100 and an encapsulation layer 200 covering the display substrate 100. The OLED panel can be applied to a display device, and the display device can be a flexible display device. Of course, the display device can also be a non-deformable and nonbendable display device, for example, display devices on mobile phones, computers, watches, etc.

The above-mentioned display substrate 100 includes a substrate 110 and a pixel circuit which is fabricated on the substrate 110 and arranged in an array. The pixel circuit includes multiple TFTs (Thin Film Transistors) and capacitors. The present disclosure may not limit the type of TFT. For example, the above-mentioned TFT may be a TFT of a top-gate type or a bottom-gate type, alternatively, it may also be a TFT of a double-gate type.

In addition, the substrate 110 is further covered with an insulating layer 120 (Inter Layer Dielectric, ILD), a planarization layer 130 (PLN) of the pixel circuit, and an organic light emitting layer 140 in sequence. The above-mentioned organic light-emitting layer 140 may be a red (R) organic light-emitting layer 140, a green (G) organic light-emitting layer 140, or a blue (B) organic light-emitting layer 140. Alternatively, when a color filter layer is provided in the display substrate 100, the organic light emitting layer 140 may also be a white organic light emitting layer 140.

As shown in the drawing, the organic light emitting layer 140 may include a first electrode layer 141, a pixel definition layer (PDL) 142, a first organic layer 143, a light emitting layer (EL) 144, a second organic layer 145 and a second electrode layer 146 that are stacked. Among them, the first electrode layer 141 is closer to the planarization layer 130 than the second electrode layer 146. The first electrode layer 141 is an anode (AND), and the second electrode layer 146 is a cathode (CTD). The first organic layer 143 can be a Hole Transport Layer (HTL) and a Hole Injection Layer (HIL), and the second organic layer 145 can be an Electron Injection Layer (EIL) and an Electron Transport Layer (ETL). Of course, in other embodiments, the first electrode layer 141 may be a cathode, and correspondingly, the second electrode layer 146 may be an anode. The first organic layer 143 may be an electron injection layer (EIL) and an electron transport layer (ETL), and the second organic layer 145 may be a hole transport layer (HTL) and a Hole Injection Layer (HIL). The organic light emitting layer 140 may also be another type of OLED light emitting structure.

The encapsulation layer 200 includes a first inorganic layer 210, an organic layer 220, and a second inorganic layer 230 that are stacked. The first inorganic layer 210 is closer to the display substrate 100 than the second inorganic layer 230, and the organic layer 220 is sandwiched between the first inorganic layer 210 and the second inorganic layer 230.

The material constituting any one of the first inorganic layer 210 and the second inorganic layer 230 may include $SiN_x$, SiCN, $SiO_2$, SiNO, $Al_2O_3$, and the like. In addition, the above-mentioned first inorganic layer 210 and/or the second inorganic layer 230 may be formed by chemical vapor deposition (CVD), physical vapor deposition (PVD), atomic layer deposition (ALD), etc.

The material constituting the organic layer 220 may include acrylic-based polymer, silicon-based polymer, epoxy-based polymer, or the like. The ink (organic material) can be provided on the first inorganic layer 210 by ink jet printing (IJP), spin coating, spray coating, etc., and the ink (organic material) can be cured by light or heat. The organic layer 220 is formed after the curing of the ink. The organic layer 220 is a flexible component, and the first inorganic layer 210 and the second inorganic layer 230 are provided have the organic layer 220 sandwiched to protect and support the organic layer 220.

It should be noted that this embodiment is described with the example of the encapsulation layer 200 being a three-layer structure, and therefore includes the first inorganic layer 210, the organic layer 220, and the second inorganic layer 230. Of course, the encapsulation layer 200 can also have a structure of five layers, seven layers or other amount layers. For any type of encapsulation layer 200, the bottom and top thin film layers in the encapsulation layer 200 are inorganic layers, with the inorganic layers and the organic layer 220 overlapping each other. Among them, the inorganic layer plays a role of blocking water vapor and oxygen, and the organic layer 220 serves as a flexible component in the TFE encapsulation to improve the flexibility of the entire encapsulation layer 200. When the substrate 110 is made of a flexible material, the display device including the encapsulation layer 200 may be a flexible display device.

In addition, the display substrate 100 further includes a protective layer 300 and an optical coupling layer 400 (Capping Layer, CPL) that are stacked. The protective layer 300 and the optical coupling layer 400 are formed between the organic light emitting layer 140 and the encapsulation layer 200. Specifically, the protective layer 300 is deposited on the optical coupling layer 400, and its material may be lithium fluoride (LiF). The optical coupling layer 400 is deposited on the second electrode layer 146 of the organic light-emitting layer 140, and has a small light absorption coefficient, which can increase the light-emitting rate of the organic light-emitting layer 140.

In this embodiment, the OLED panel includes a display substrate having a display area C1 and a non-display area C2. The non-display area C2 is located around the display area C1. The OLED panel further includes an encapsulation layer, a dam 500 and an isolation column 600. The encapsulation layer 200 covers the display substrate. Both the dam 500 and the isolation column 600 are located in the non-display area C2. Moreover, the isolation column 600 and the dam 500 are both disposed on the upper surface of the non-display area C2 of the display substrate 100, and the isolation column 600 is disposed on the side of the dam 500 close to the display area C1, that is, the distance between the isolation column 600 and the display area C1 is less than the distance between the dam 500 and the display area C1, in order to prevent the ink (organic layer 220) from overflowing to the dam 500. This configuration can avoid or suppress the overflow phenomenon and achieve the purpose of controlling the ink from flowing beyond the preset range.

When the organic layer 220 is manufactured by the inkjet printing process, the ink that constitutes the organic layer 220 will diffuse after being dropped onto the upper surface of the first inorganic layer 210 in the display area C1, and is in contact with the upper surface of the first inorganic layer 210 in the non-display area C2. In order to prevent ink from flowing to the dam 500, an isolation column 600 is provided on the side of the dam 500 close to the display area C1. The isolation column 600 can restrict the flow of ink in the direction towards the dam 500, thereby effectively preventing the organic layer 220 of the OLED panel from overflow at the edge. In this way, the isolation column 600 is at least partially in contact with the ink of the organic layer 220, and the second inorganic layer 230 is formed on the organic layer 220 after the dam 500 and the organic layer is formed, so as to protect the organic layer 220.

The first inorganic layer 210 wraps the dam 500 and the isolation column 600, and the second inorganic layer 230 should at least wrap the dam 500 to achieve effective encapsulation of the organic layer 220.

Through the above arrangement, the path for external impurities such as water vapor and oxygen to enter the OLED through the gap between the organic layer 220 and the first inorganic layer 210 or the second inorganic layer 230 is increased, thereby reducing the impact of external impurities such as water vapor and oxygen on the OLED panel, achieving effective encapsulation, and improving the encapsulation reliability.

It should be noted that the upper surface of the display substrate 100 refers to the surface of the display substrate 100 away from the substrate 110.

As shown in FIG. 1, the first inorganic layer 210 includes at least a central portion 213, a laterally extending portion 211 and a wrapping portion 212. The central portion 213 covers the display area C1 and its adjacent area (i.e., an area of the non-display area C2 close to the display area C1) and is roughly in a stepped shape. The wrapping portion 212 covers the isolation column 600. The lateral extending portion 211 is adjacent to the wrapping portion 212 and located on a side of the wrapping portion 212 close to the display area C1, and connects the central portion 213 and the wrapping portion 212. In addition, compared with the height of the central portion 213 and the wrapping portion 212 from the substrate 110, the height of the lateral extending portion 211 from the substrate 110 is the lowest.

The results of multiple tests all show that when the width X of the lateral extending portion 211 is set to about 50 microns, 150 microns, or 300 microns, the ink does not overflow; but when the width X of the lateral extending portion 211 is set to be less than 50 microns, the ink will overflow at the edge. That is, when the width X of the lateral extending portion 211 is greater than or equal to about 50 microns, the isolation column 600 can effectively restrict the flow of the organic layer 220 (ink). Through the above arrangement, more accommodating space can be reserved for the ink, and the ink with a large flow rate is prevented from overflowing directly to the side of the isolation column 600 away from the display area C1, thereby effectively using the isolation column 600 to limit the flow of the ink.

In this embodiment, in the direction from top to bottom (the direction from a position away from the substrate 110 to a position close to the substrate 110), the width L of the cross section of the isolation column 600 in the direction perpendicular to the substrate 110 gradually decreases. That is to say, the width of the side of the isolation column 600 that is away from the substrate 110 in the direction perpendicular to the substrate 110 is greater than the width of the side that is close to the substrate 110. For example, the cross section may be an inverted trapezoid, which includes a bottom surface, a top surface, and two sidewall surfaces connecting the bottom surface and the top surface. It can better restrict the flow of ink. It should be noted that the direction from bottom to top in the text refers to the direction from the organic light-emitting layer 140 to the encapsulation layer 200, and the direction from top to bottom refers to the direction from the encapsulation layer 200 to the organic light-emitting layer 140. That is, the width L of the cross section of the isolation column 600 in the direction perpendicular to the substrate 110 gradually increases as the distance from the upper surface of the non-display area of the display substrate increases.

The isolation column 600 has an included angle α between the sidewall surface of the cross section in the direction perpendicular to the substrate 110 and the upper surface of the display substrate 100, and the included angle α is an acute angle. Through the above arrangement, along the direction from top to bottom, the sidewall surface 610 of the isolation column 600 close to the display area C1 is inclined toward the direction away from the display area C1 (i.e., outward), thereby reducing the chance of the ink climbing on the sidewall surface of the isolation column 600. The flow of ink is further controlled, and ink is prevented from flowing to the dam 500 and the occurrence of edge overflow.

As shown in FIG. 1, in this embodiment, the angle α between the sidewall surface 610 of the cross section of the isolation column 600 in the direction perpendicular to the substrate 110 and the horizontal plane of the display substrate 100 is 60 degrees. Multiple experiments have shown that when a is 60 degrees, the ink climbing on the sidewall surface 610 of the isolation column 600 can be better prevented, the flow of ink can be better limited, and effective encapsulation can be achieved. At the same time, better strength and stability of the isolation column 600 can be ensured. Of course, a large number of experiments have shown that when the included angle α is greater than or equal to about 40 degrees and less than or equal to about 70 degrees, the isolation column 600 can also limit the ink from climbing. The isolation column 600 with an inverted trapezoidal structure in a cross section perpendicular to the substrate 110 includes a bottom surface close to the substrate 110, a top surface away from the substrate 110, and two sidewall surfaces 610 connecting the bottom surface and the top surface. The angle between the sidewall surface 610 closer to the display area C1 and the horizontal plane of the display substrate 100 is a.

There are multiple isolation columns 600. As shown in the drawing, in this embodiment, the number of isolation columns 600 is two. Of course, in other embodiments, the number of isolation columns 600 can also be three, four or more. Each isolation column 600 has a ring shape and surrounds the organic layer 220 and the display area C1 to limit the organic layer 220 from overflowing. Moreover, the isolation column 600 away from the display area C1 will surround the isolation column 600 closer to the display area C1. When the amount of the organic layer 220 (ink) is too much, or the width X of the lateral extending portion 211 is too narrow, it may cause the organic layer 220 (ink) to overflow out of the isolation column 600 located on the inner side (closer to the display area C1), that is, flow to a side of inner the isolation column 600 close to the dam 500. At this time, the isolation column 600 located on the outside can further limit the overflowing organic layer 220 (ink), so as to prevent the organic layer 220 (ink) from flowing to the dam 500 and the occurrence of overflowing at the edge, so as to achieve effective encapsulation. In this embodiment, the minimum value of the width L of the isolation column 600 is about 10 microns to ensure the strength of the isolation column 600. In other embodiments according to the present disclosure, the minimum value of the width L of the cross section of the isolation column 600 in the direction perpendicular to the substrate 110 is greater than or equal to about 10 microns. Here, about 10 microns means that there is no requirements for a strict limit, and may include the value within the range of process error and measurement error.

Figure 2:
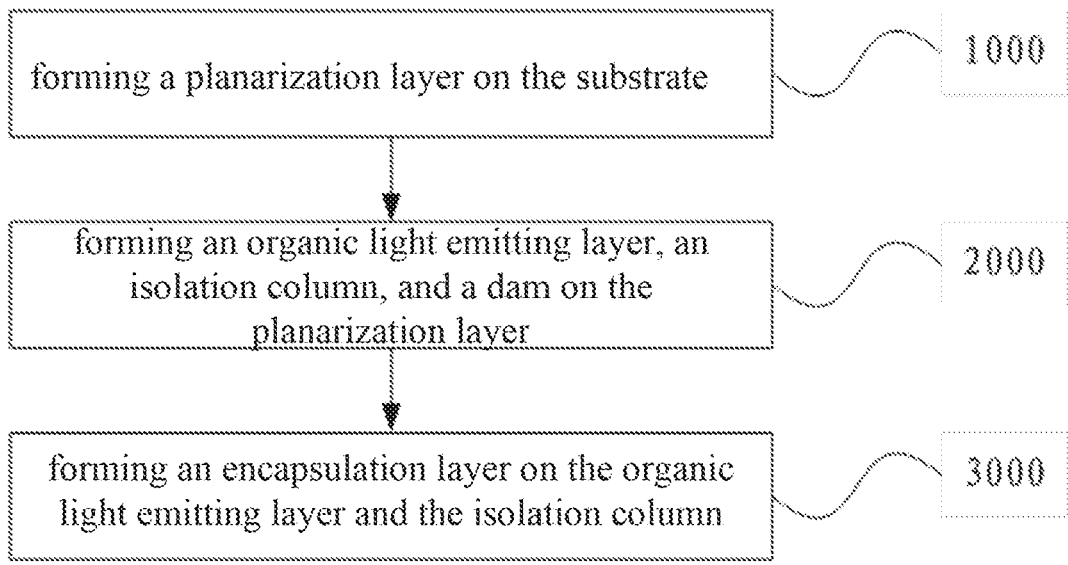
FIG. 2 is a simple flow diagram of a method of manufacturing a display panel according to an embodiment of the present disclosure.

The embodiments of the present disclosure also provide a method of manufacturing an OLED panel, and the method of manufacturing the OLED panel is used for manufacturing the above-mentioned OLED panel. The method of manufacturing the OLED panel, as shown in FIG. 2, includes the following steps:

Step 1000: forming a planarization layer 130 on the substrate 110.

Step 2000: forming an organic light emitting layer 140, an isolation column 600, and a dam 500 on the planarization layer 130, wherein the organic light emitting layer 140 is formed in the display area C1, and the isolation column 600 and the dam 500 are formed in the non-display area C2. The organic light emitting layer 140, the planarization layer 130, and the substrate 110 serve as the display substrate 100.

Step 3000: forming an encapsulation layer 200 on the organic light emitting layer 140 and the isolation column 600.

In this embodiment, the step of forming the insulating layer 120 may be further included before the planarization layer 130 is formed.

Figure 3:
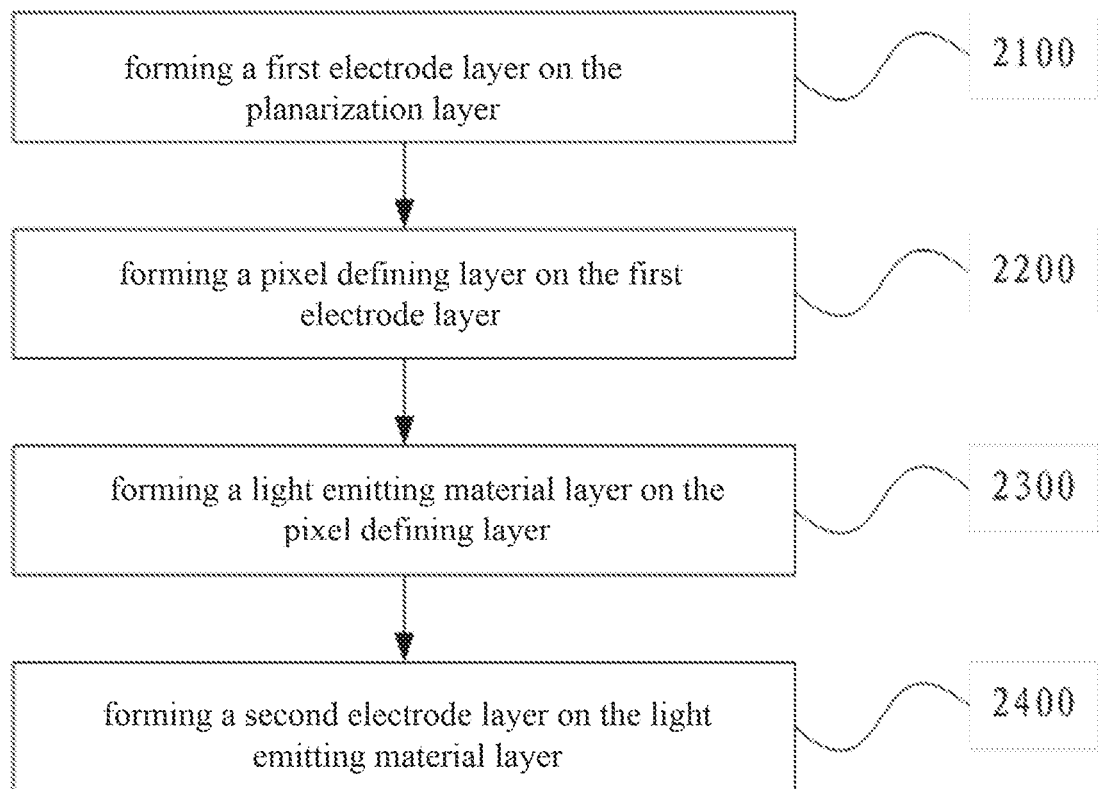
FIG. 3 is a flow diagram of forming an organic light emitting layer on a planarizing layer according to an embodiment of the present disclosure.

As shown in FIG. 3, the step of forming the organic light-emitting layer 140 on the planarization layer 130 includes:

Step 2100: forming a first electrode layer 141 on the planarization layer 130.

Step 2200: forming a pixel defining layer 142 on the first electrode layer 141.

Step 2300: forming a light emitting material layer on the pixel defining layer 142.

Step 2400: forming a second electrode layer 146 on the light emitting material layer.

The aforementioned light-emitting material layer includes a first organic layer 143, a light-emitting layer 144, and a second organic layer 145 that are stacked. Specifically, step 2300 may include: forming a first organic layer 143 on the pixel defining layer 142, forming a light-emitting layer 144 on the first organic layer 143, and forming a second organic layer 145 on the light-emitting layer 144.

In this embodiment, the first electrode layer 141 is an anode, and the second electrode layer 146 is a cathode. Of course, in other embodiments, the first electrode layer 141 may be a cathode, and correspondingly, the second electrode layer 146 is an anode.

On this basis, the isolation column 600 and the dam 500 are formed between the step of forming a light emitting material layer on the pixel defining layer 142 (step 2300) and the step of forming the second electrode layer 146 on the light emitting material layer (step 2400). In other embodiments, the isolation column 600 may be formed synchronously with the light emitting material layer, or alternatively, the isolation column 600 and the dam 500 may also be formed synchronously with the second electrode layer 146. Here, it is not limited.

In this embodiment, the isolation column 600 is formed by irradiating a low-temperature negative photoresist. In other embodiments, the isolation column 600 may also be made of a positive photoresist material or other materials.

In this embodiment, a step of forming an optical coupling layer 400 and a protective layer 300 is further included between step 2000 and step 3000, so as to increase the light extraction rate of the organic light-emitting layer 140 and protect the organic light-emitting layer 140.

The above are only the preferred embodiments of the present disclosure, and do not limit the present disclosure in any form. Although the present disclosure has been disclosed as the preferred embodiments, it is not intended to limit the present disclosure. Anyone familiar with the professional technology can use the above disclosed technical content to make slight changes or modification to form an equivalent embodiments with equivalent changes, without departing from the scope of the technical solution of the present disclosure. But any content that does not depart from the technical solution of the present disclosure, any simple modifications, equivalent changes, and modifications made to the above embodiments according to the disclosed technical essence still fall within the scope of the technical solutions of the present disclosure.

What is claimed is:

1. A display panel, including:
a display substrate having a display area and a non-display area, the display substrate including a substrate;
a dam on an upper surface of the non-display area of the display substrate; and
an encapsulation layer covering the display substrate,
wherein the encapsulation layer includes a first inorganic layer, an organic layer and a second inorganic layer, the upper surface of the non-display area of the display substrate is further provided with an isolation column, and a distance between the isolation column and the display area is smaller than a distance between the dam and the display area, the isolation column is at least partially in contact with the organic layer, and the dam is at least partially not in contact with the organic layer, a width of a surface of the isolation column that is away from the substrate in a cross section along a direction perpendicular to the substrate is larger than that a width of a surface that is close to the substrate,
wherein a width of a cross-section of the isolation column along the direction perpendicular to the substrate gradually increases as a distance from the upper surface of the non-display area of the display substrate increases, a width of a cross-section of the dam along the direction perpendicular to the substrate gradually decreases as the distance from the upper surface of the non-display area of the display substrate increases, a portion of the second inorganic layer contacts with a wrapping portion of the first inorganic layer directly, and the wrapping portion of the first inorganic layer and the portion of the second inorganic layer completely cover the surface of the isolation column, a surface of the dam and the upper surface of the non-display area between the isolation column and the dam.

2. The display panel of claim 1, wherein a minimum value of the width of the cross-sectional of the isolation column along the direction perpendicular to the substrate is greater than or equal to about 10 microns.

3. The display panel of claim 1, wherein the cross section of the isolation column along the direction perpendicular to the substrate is an inverted trapezoid, the inverted trapezoid includes a bottom surface, a top surface and two side wall surfaces connecting the bottom surface and the top surface, there is an included angle between the side wall surface closer to the display area and the upper surface of the display substrate, and the included angle is an acute angle.

4. The display panel of claim 3, wherein the included angle is greater than or equal to about 40 degrees and less than or equal to about 70 degrees.

5. The display panel of claim 4, wherein the included angle is about 60 degrees.

6. The display panel of claim 1, wherein the organic layer is sandwiched between the first inorganic layer and the second inorganic layer, the first inorganic layer is closer to the display substrate than the second inorganic layer, and the isolation column is wrapped by the first inorganic layer.

7. The display panel of claim 6, wherein the first inorganic layer further includes a central portion and a laterally extending portion, the central portion at least covers the display area, the wrapping portion covers the isolation column, the lateral extending portion connects the wrapping portion and the central portion and is located on a side of the wrapping portion close to the display area;
a width of the lateral extending portion is greater than or equal to about 50 microns.

8. The display panel according to claim 7, wherein the central portion covers the display area and an area of the non-display area close to the display area, and has a stepped shape;
a height of the lateral extending portion from the substrate is smaller than heights of the central portion and the wrapping portion from the substrate.

9. The display panel of claim 1, wherein multiple isolation columns are provided, each of the isolation columns is ring-shaped and surrounds the display area, and the isolation column farther away from the display area surrounds the isolation columns closer to the display area.

10. The display panel of claim 1, wherein the display panel is an OLED panel.

11. The display panel of claim 1, wherein the display area comprises a cover insulating layer on the substrate, a planarization layer on the cover insulating layer, and an organic light emitting layer on the planarization layer.

12. The display panel of claim 11, wherein the organic light emitting layer comprises a first electrode layer, a pixel defining layer, a light emitting material layer, and a second electrode layer that are sequentially stacked.

13. The display panel of claim 12, wherein the light emitting material layer comprises a first organic layer, a light emitting layer and a second organic layer that are sequentially stacked.

14. The display panel of claim 13, wherein the first electrode layer serves as an anode, the second electrode layer serves as a cathode, the first organic layer serves as a hole transport layer and a hole injection layer, the second organic layer serves as an electron injection layer and an electron transport layer.

15. The display panel of claim 13, wherein the first electrode layer serves as a cathode, the second electrode layer serves as an anode, the first organic layer serves as an electron injection layer and an electron transport layer, and the second organic layers serves as a hole transport layer and a hole injection layer.

16. The display panel of claim 12, wherein the isolation column and the light emitting material layer are located in the same layer and are formed of the same material.

17. The display panel of claim 12, wherein the isolation column and the second electrode layer are located in the same layer and are formed of the same material.

18. The display panel of claim 1, wherein the isolation column is formed of a negative photoresist or a positive photoresist.

19. A method of manufacturing the display panel according to claim 1, wherein the method of manufacturing the display panel comprises the following steps:
forming a planarization layer on the substrate;
forming an organic light emitting layer, the isolation column and the dam on the planarization layer, the organic light emitting layer, the planarization layer and the substrate serves as the display substrate; and
forming the encapsulation layer on the organic light emitting layer and the isolation column,
wherein the encapsulation layer includes the first inorganic layer, the organic layer and the second inorganic layer, the upper surface of the non-display area of the display substrate is further provided with the isolation column, and the distance between the isolation column and the display area is smaller than the distance between the dam and the display area, the isolation column is at least partially in contact with the organic layer, and the dam is at least partially not in contact with the organic layer, the width of the surface of the isolation column that is away from the substrate in the cross section along the direction perpendicular to the substrate is larger than that the width of a surface that is close to the substrate,
wherein the width of a cross-section of the isolation column along the direction perpendicular to the substrate gradually increases as the distance from the upper surface of the non-display area of the display substrate increases, the width of a cross-section of the dam along the direction perpendicular to the substrate gradually decreases as the distance from the upper surface of the non-display area of the display substrate increases, the portion of the second inorganic layer contacts with the wrapping portion of the first inorganic layer directly, and the wrapping portion of the first inorganic layer and the portion of the second inorganic layer completely cover the surface of the isolation column, the surface of the dam and the upper surface of the non-display area between the isolation column and the dam.

20. The method of manufacturing the display panel of claim 19, wherein the step of forming the organic light emitting layer on the planarization layer comprises:
forming a first electrode layer on the planarization layer;
forming a pixel defining layer on the first electrode layer;
forming a light emitting material layer on the pixel defining layer; and
forming a second electrode layer on the light emitting material layer;
wherein the isolation column is formed between the step of forming the light emitting material layer on the pixel defining layer and the step of forming the second electrode layer on the light emitting material layer, or the isolation column is formed synchronously with the light emitting material layer, or the isolation column is formed synchronously with the second electrode layer.

21. The method of manufacturing the display panel of claim 19, wherein the isolation column is formed by irradiating a low temperature negative photoresist.

22. A display device, wherein the display device includes the display panel according to claim 1.

* * * * *